United States Patent
Berhanu et al.

(10) Patent No.: US 8,189,723 B2
(45) Date of Patent: May 29, 2012

(54) METHOD, CIRCUIT, AND DESIGN STRUCTURE FOR CAPTURING DATA ACROSS A PSEUDO-SYNCHRONOUS INTERFACE

(75) Inventors: Malede W. Berhanu, Colchester, VT (US); Christopher D. Hanudel, Williston, VT (US); Mark W. Kuemerle, Essex Junction, VT (US); David W. Milton, Underhill, VT (US); Clarence R. Ogilvie, Huntington, VT (US); Jack R. Smith, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 867 days.

(21) Appl. No.: 12/192,571

(22) Filed: Aug. 15, 2008

(65) Prior Publication Data

US 2010/0039150 A1 Feb. 18, 2010

(51) Int. Cl.
*H04L 7/00* (2006.01)
(52) U.S. Cl. ........ 375/354; 327/237; 327/241; 327/243; 327/245; 327/258; 327/269; 327/270; 327/271; 327/272; 327/273; 713/401; 713/502
(58) Field of Classification Search ................. 375/354, 375/376; 713/500, 600, 400–401, 502; 327/237, 327/241, 243, 245, 258, 269–273
See application file for complete search history.

(56) References Cited

U.S. PATENT DOCUMENTS

| | | | |
|---|---|---|---|
| 5,086,236 A | 2/1992 | Feemster | |
| 5,568,526 A | 10/1996 | Ferraiolo et al. | |
| 5,796,795 A | 8/1998 | Mussman et al. | |
| 6,108,795 A | 8/2000 | Jeddeloh | |
| 6,147,927 A | 11/2000 | Ooishi | |
| 6,316,980 B1 * | 11/2001 | Vogt et al. | 327/273 |
| 6,397,374 B1 | 5/2002 | Pasqualini | |
| 6,442,102 B1 | 8/2002 | Borkenhagen et al. | |
| 7,185,220 B2 | 2/2007 | Kessels et al. | |
| 7,543,172 B2 * | 6/2009 | Kizer et al. | 713/401 |
| 2008/0181348 A1 * | 7/2008 | Best et al. | 375/376 |
| 2010/0271092 A1 * | 10/2010 | Zerbe et al. | 327/161 |

OTHER PUBLICATIONS

Office Action dated Apr. 13, 2011 in U.S. Appl. No. 12/192,586.

* cited by examiner

*Primary Examiner* — Eva Puente
*Assistant Examiner* — Eboni Hughes
(74) *Attorney, Agent, or Firm* — David Cain; Roberts Mlotkowski Safran & Cole, P.C.

(57) ABSTRACT

A method for source synchronous communication. The method includes dynamically adjusting a delay that is applied to a data signal and a remote clock signal until a delayed remote clock signal is synchronized with a local clock signal, and capturing data from a delayed data signal associated with the delay in a local domain.

15 Claims, 7 Drawing Sheets

METHOD, CIRCUIT, AND DESIGN STRUCTURE FOR CAPTURING DATA ACROSS A PSEUDO-SYNCHRONOUS INTERFACE

CROSS-REFERENCE TO RELATED APPLICATIONS

This application is related to U.S. Ser. No. 12/192,586, filed on Aug. 15, 2008, and published as U.S. Pub. No. 2010/0040183.

FIELD OF THE INVENTION

The invention relates to on-chip source synchronous communication, and more particularly, to a design structure, structure, and method for capturing data across a pseudo-synchronous interface.

BACKGROUND

In recent chip designs a large amount of time and effort are spent designing very low skew clock trees for high performance chips. These clock trees are costly to develop and, because of their high performance nature, they consume a relatively large amount of power. These factors are particularly evident when performing cross-chip data transfers.

Communication across a chip typically involves data paths being buffered if the distance for the communication is beyond the distance that can be communicated in a single cycle of the clock. Latches may also be used in addition to buffers. For example, a combination of buffers and latches is commonly used to account for process, temperature, and voltage variations. Additionally, latched pipelined communication clocks are created with very tight tolerance on the clock skew.

A conventional technique employed to eliminate this tight skew tolerance is to use source synchronous data transfers. In a source synchronous application, a clock signal is sent along with the data from a source (e.g., a remote location on a chip) to a destination (e.g., a local location on the same chip). In such an application, the data is synchronized with the local domain before it can be considered valid for use at the local domain.

Conventional systems and methods for re-synchronizing the data utilize intermediate clocks and latched pipelines. In these methods remote data is sent to an intermediate domain where the clock is shifted to accommodate jitter in the data due to PVT effects. A FIFO, which typically comprises registers, is then needed so that a steady stream of data is provided to the local clock domain. If data was sent from the intermediate domain directly to the local domain without a FIFO, there would be cases where the local clock would capture the same data twice and in some cases may miss blocks of data. However, the use of intermediate clock domains and latched pipelines increases the design complexity and power consumption of a chip.

Accordingly, there exists a need in the art to overcome the deficiencies and limitations described hereinabove.

SUMMARY

In a first aspect of the invention, there is a method for source synchronous communication. The method comprises dynamically adjusting a delay that is applied to a data signal and a remote clock signal until a delayed remote clock signal is synchronized with a local clock signal, and capturing data from a delayed data signal associated with the delay in a local domain.

In a second aspect of the invention, there is a method for on-chip source synchronous communication. The method includes providing a circuit comprising hardware structured and arranged to: apply a delay to a data signal and a remote clock signal aligned with the data signal, wherein the delay is based upon a value held in a delay register; change the value in the delay register based upon at least one captured state of a delayed remote clock signal, wherein the at least one captured state of the delayed remote clock signal is captured upon a change of state of a local clock signal; and repeat the applying and the changing at least until the delayed remote clock signal is aligned with the local clock signal.

In a third aspect of the invention, there is a method for on-chip communication comprising: receiving a data signal and a remote clock signal associated with the data signal; and applying a dynamically determined delay to both the data signal and the remote clock signal to create a delayed data signal and a delayed remote clock signal. The delayed remote clock signal is synchronized with a local clock associated with a local domain that receives the delayed data signal.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to on-chip source synchronous communication, and more particularly, to a design structure, structure, and method for capturing data across a pseudo-synchronous interface. In embodiments of the invention, a structure (e.g., a circuit) is provided in a source synchronous communication path on a chip. According to aspects of the invention, the structure includes a delay element that is dynamically adjusted with a phase detector between a remote clock and a local clock. The delay is applied to both the remote clock signal and the data signal, such that the delayed remote clock signal is synchronized with the local clock signal. In this manner, the data is synchronized with the local clock when it is captured at the local data capture register. Moreover, implementations of the invention perform the synchronization without utilizing intermediate clock domains.

Figure 1:
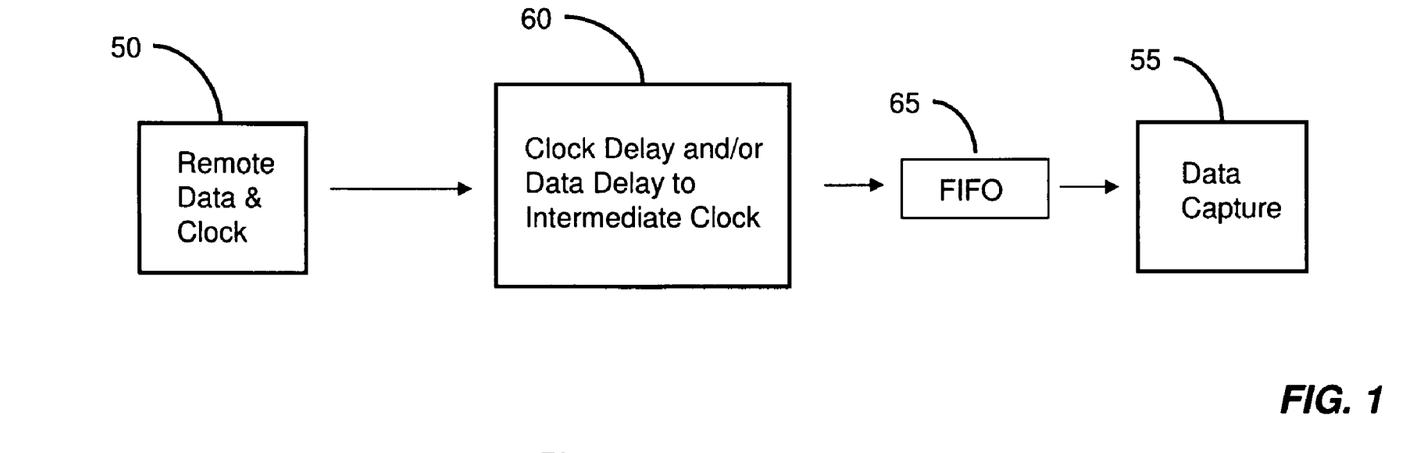
FIG. 1 shows a block diagram of a system and method for source synchronous communication.

FIG. 1 shows a block diagram depicting a system and method for source synchronous communication. At block 50, a data signal and a remote clock signal are generated at a remote (e.g., first) location of a chip. The data signal and clock signal are destined for data capture 55 at a local (e.g., second) location of the chip. In order for the data to be valid when captured at data capture 55, the remote clock signal from the remote clock should be synchronized with the local clock signal of the local clock. This synchronization is performed by intermediate clock domain 60, which includes a third clock (e.g., the intermediate clock). After synchronization at the intermediate clock domain 60, the data is held in a FIFO 65, which comprises a series of latches. The use of the intermediate clock domain 60 and FIFO 65 disadvantageously increases the power requirement of the chip.

Figure 2:
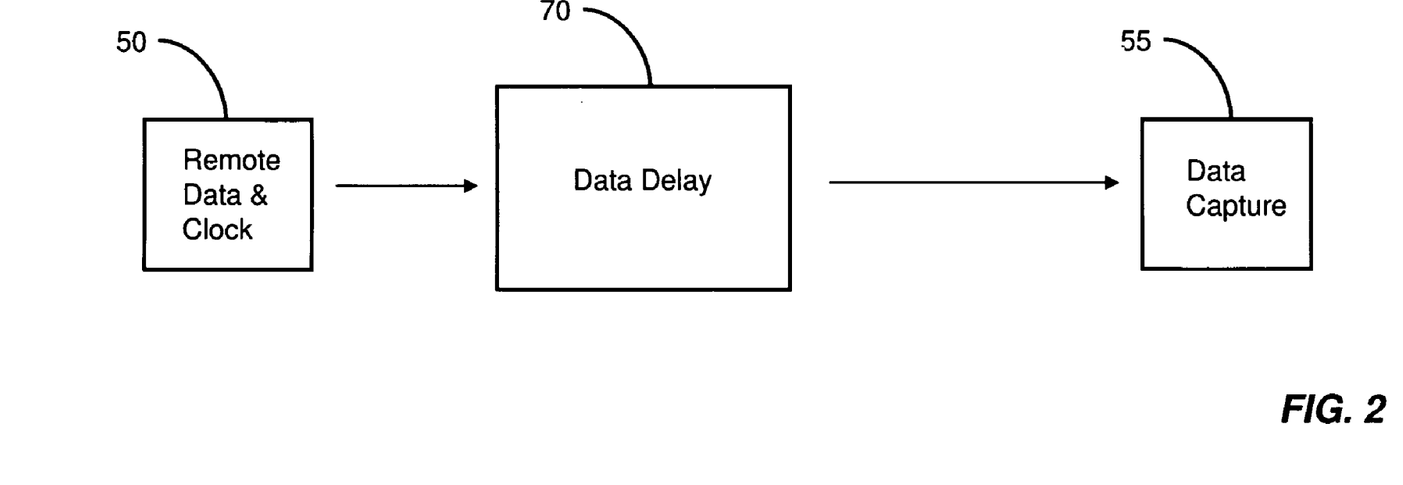
FIG. 2 shows a block diagram of a system and method for source synchronous communication according to aspects of the invention.

FIG. 2, on the other hand, shows a block diagram depicting a system and method for source synchronous communication according to aspects of the invention in which the intermediate clock domain and FIFO are eliminated. As depicted in FIG. 2, and similar to FIG. 1, a data signal and remote clock signal are generated at a remote (e.g., first) location on the chip, as represented by block 50. The data signal and clock signal are destined for data capture 55 at a local (e.g., second) location of the chip. In embodiments of the invention, a data delay structure 70 is structured and arranged to apply an iteratively determined delay to both the remote clock signal and the data signal in a manner that synchronizes the data to the local domain.

Figure 3:
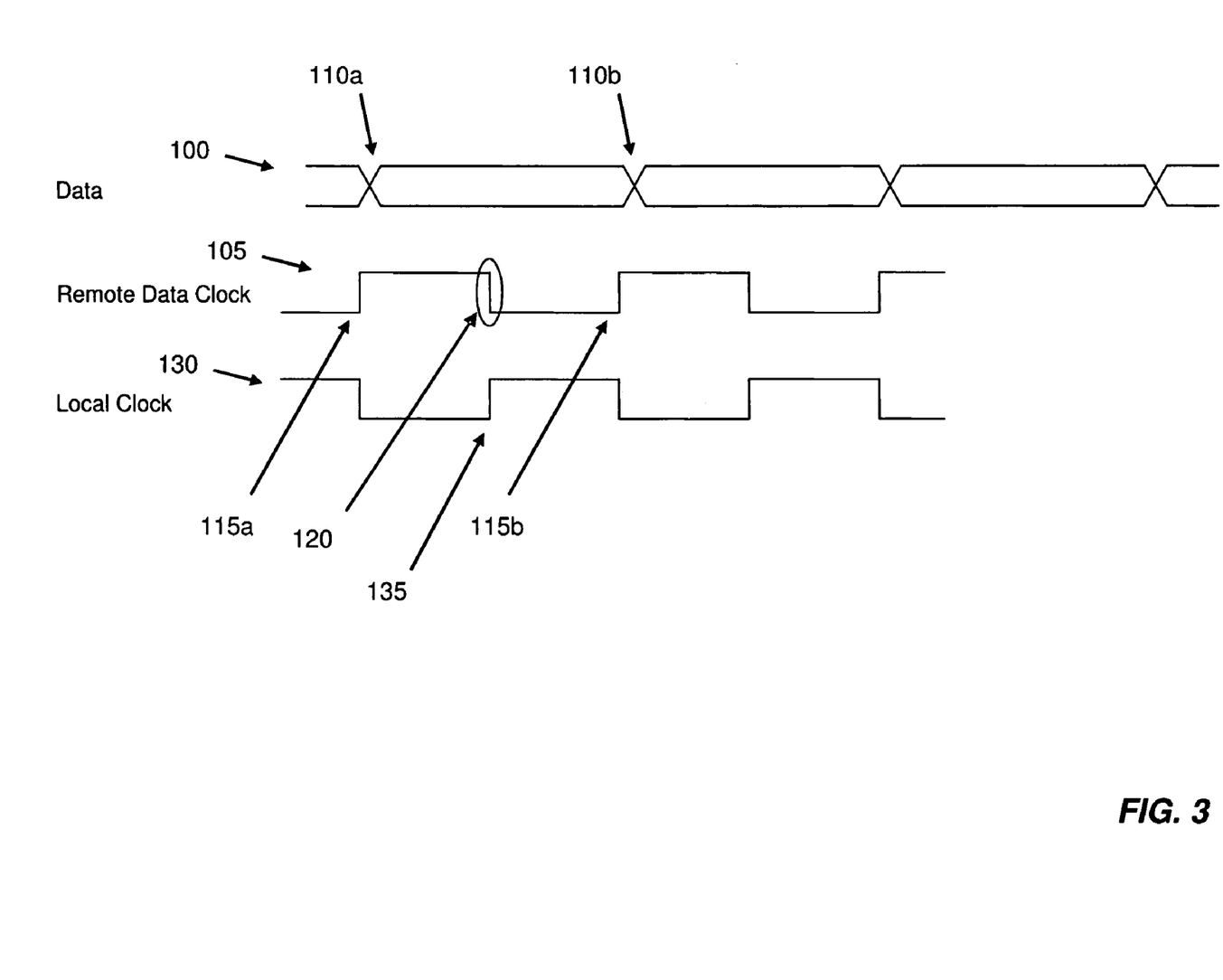
FIG. 3 shows a timing diagram according to aspects of the invention.

FIG. 3 shows a timing diagram according to aspects of the invention. FIG. 3 shows a data signal 100 generated at a remote location, and a remote clock signal 105 associated with the data signal 100 and generated by a remote clock at the same remote location. As depicted in FIG. 3, a change 110a in the data signal 100 occurs shortly in time after a rising edge 115a of the remote clock signal 105. At the falling edge 120, the remote clock signal 105 transitions from the high state to the low state, after which another rising edge 115b triggers another change 110b in the data signal 100. This is referred to as positive edge triggered logic.

FIG. 3 also shows a local clock signal 130. In embodiments of the invention, a structure is provided that causes the rising edge 135 of the local clock signal 130 to be substantially coincident with the falling edge 120 of the remote clock signal 105. As described in greater detail herein, the inventive structure synchronizes the remote clock signal 105 and the data signal 100 by applying a delay to both the remote clock signal 105 and the data signal 100. In embodiments, the amount of delay is dynamically determined.

Figure 4:
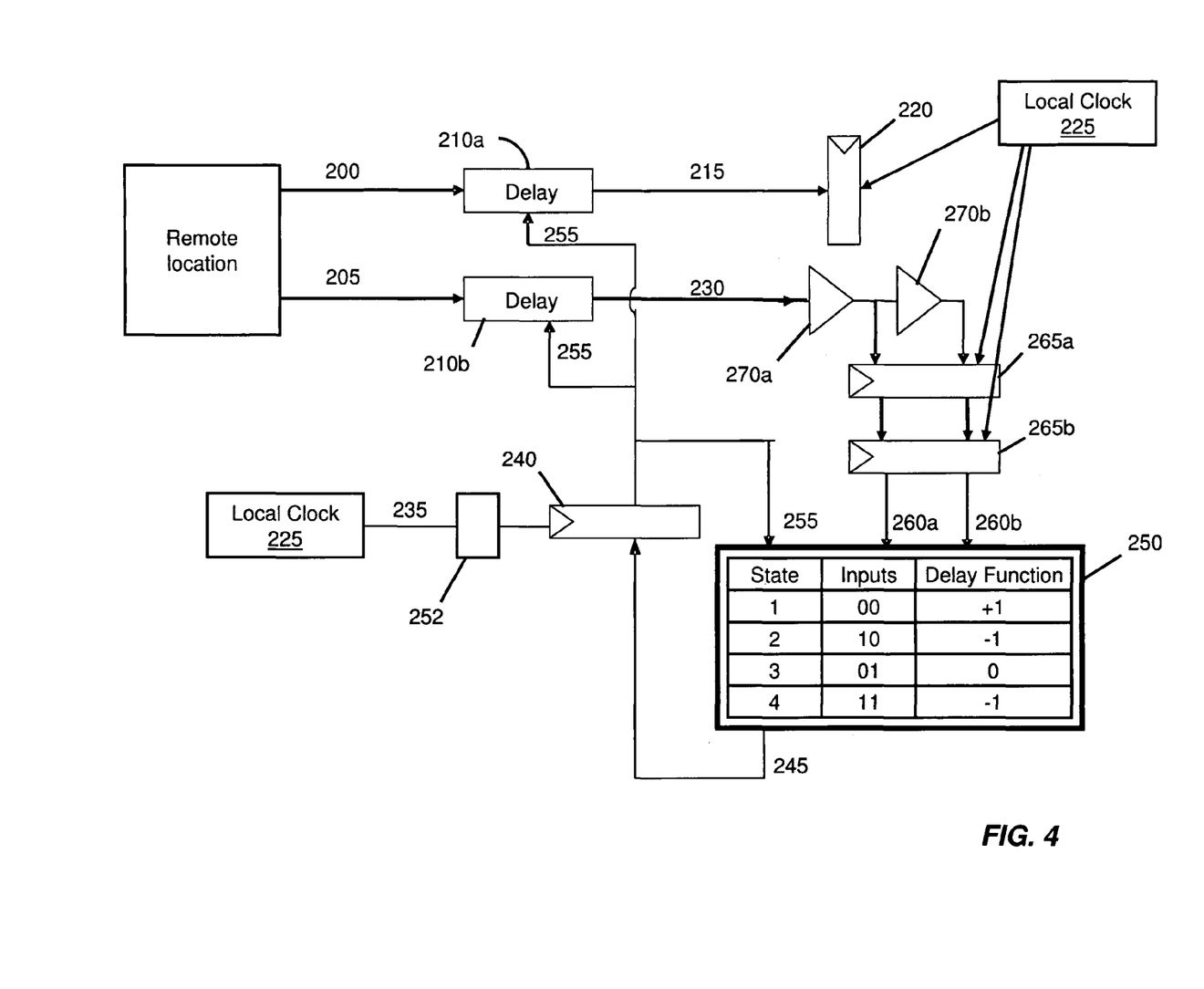
FIGS. 4 and 5 show block diagrams of systems and methods for source synchronous communication according to aspects of the invention.
Figure 5:
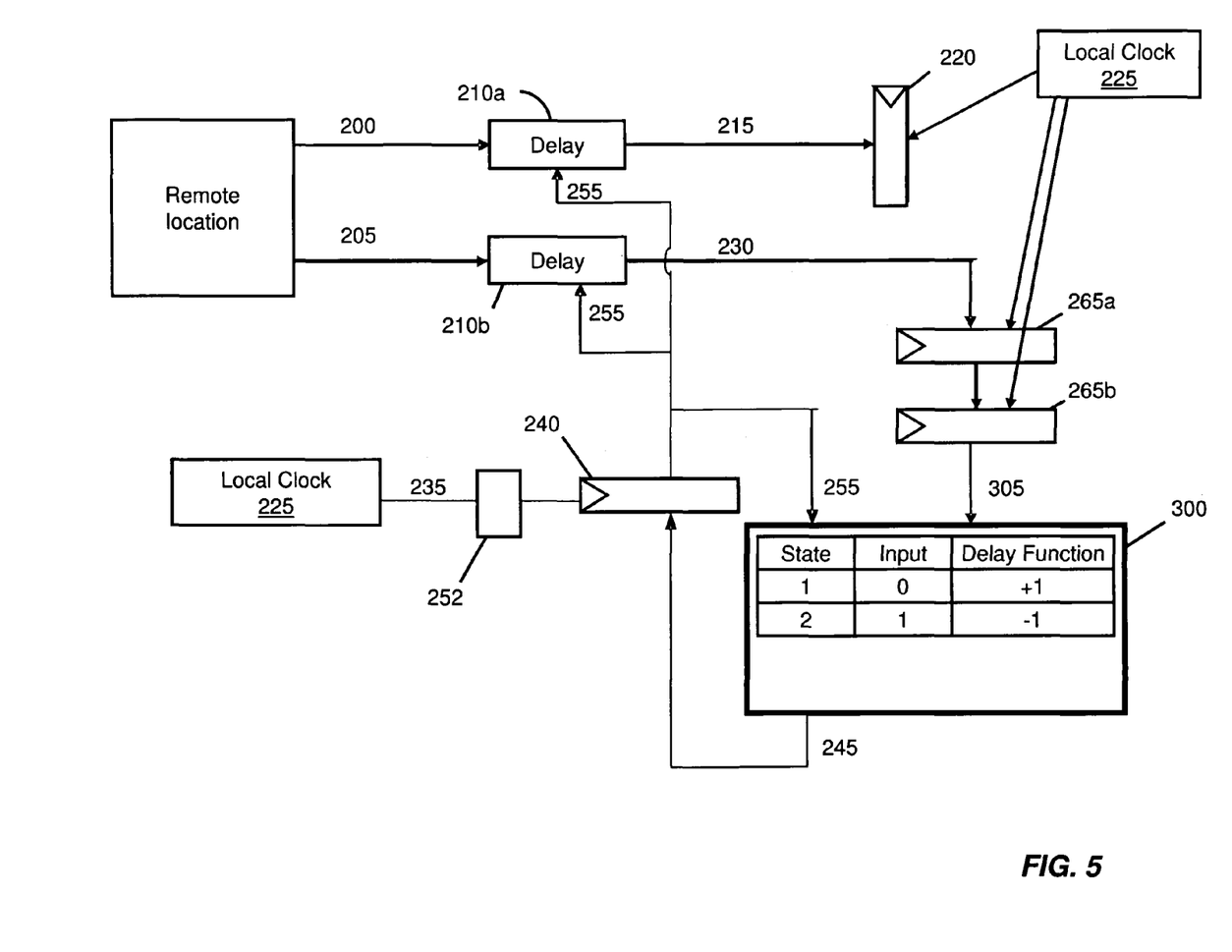

FIGS. 4 and 5 show block diagrams of systems and methods for source synchronous communication according to aspects of the invention. Particularly, FIG. 4 shows a data signal 200 and a remote clock signal 205, which may comprise signals such as those already described herein (e.g., a data and remote clock signal generated together at a remote location of a chip and used for source synchronous communication to another location of the chip). The data signal 200 and a remote clock signal 205 may be generated using conventional techniques. Data signal 200 is input into delay structure 210a, and remote clock signal 205 is input into delay structure 210b. The delay structures 210a and 210b apply a delay (e.g., time shift) to the respective signals, and are described in greater detail herein.

According to aspects of the invention, the delayed data signal 215 is provided to a local data capture register 220. The local data capture register 220 is associated with a local domain and a local clock 225, as is known such that further explanation is not necessary for an understanding of the invention. Plural instances of the local clock 225 are depicted in FIGS. 4 and 5; however, it is understood that these refer to a common local clock. When the delayed remote clock signal 230 is aligned (e.g., synchronized) with the local clock signal 235 (for example, as described with respect to FIG. 3), the data is considered valid for use by the local domain. On the other hand, when the delayed remote clock signal 230 is not aligned with the local clock signal 235, the data is not valid for use by the local domain. Accordingly, implementations of the invention dynamically determine an appropriate delay (e.g., that causes synchronization), and apply this delay to both the data signal 200 and the remote clock signal 205 via the delay blocks 210a and 210b.

Still referring to FIG. 4, embodiments of the invention include a delay register 240, which holds (e.g., stores) a value corresponding to a delay that will be applied via the delay blocks 210a and 210b. In embodiments, the delay register 240 is an 8 bit register, but the invention is not limited in this manner, and any suitable register may be used within the scope of the invention. In embodiments, the value (e.g., 8 bit number) stored in the delay register 240 is updated on every $5^{th}$ cycle of local clock 225, based upon a new value 245 output from a state machine 250. Every $5^{th}$ cycle of the local clock may be provided by a frequency divider (e.g., clock divider) 252, which is known such that further explanation is not believed necessary. Moreover, the invention is not limited to every $5^{th}$ cycle, but rather other frequencies of the clock cycle may be used within the scope of the invention. Also, upon every cycle of the local clock 225, the current value 255 stored in the delay register 240 is sent to the delay blocks 210a and 210b and as an input to the state machine 250.

In embodiments, the state machine 250 receives two other inputs 260a and 260b on every cycle of the local clock 225. According to aspects of the invention, these inputs 260a and 260b each represent a respective captured state (e.g., snapshot) of the delayed remote clock signal 230. That is to say, each input 260a and 260b will have a value of either one (e.g., high) or zero (e.g., low), depending on the state of the delayed remote clock signal 230 when captured upon triggering by the local clock 225. Registers 265a and 265b constitute a dual rank synchronization system that statistically ensures that each input 260a and 260b will have a value of zero or one, and will not have a value between zero and one, which would happen if the data capture occurred precisely on the rising edge or falling edge of the delayed remote clock signal 230. Dual rank synchronization systems are known, such that further explanation is not necessary to understand the invention.

In embodiments, buffers 270a and 270b operate to cause the inputs 260a and 260b to be slightly offset from one another in terms of where each input corresponds to the delayed remote clock signal 230. More specifically, first input 260a is captured after the delayed remote clock signal 230 travels through the first buffer 270a, and second input 260b is captured after the delayed remote clock signal 230 travels through the first buffer 270a and the second buffer 270b. For example, if the second buffer 270b imparts a delay of "1" unit of time, and if the first input 260a corresponds to the state of the delayed remote clock signal 230 at time "t," then the second input 260b corresponds to the state of the delayed remote clock signal 230 at time "t+1". The buffers 270a and 270b may be designed and structured to impart any desired difference between the first input 260a and the second input 260b.

Still referring to FIG. 4, the state machine 250 operates, on every $5^{th}$ cycle of the local clock 225, to receive the following three inputs: the current value 225 of the held (e.g., stored) in the delay register 240, and the respective states of the delayed remote clock signal 230 as first input 260a and second input

260b. Based upon these three inputs, the state machine 250 generates and outputs a new value 245 to be stored in the delay register 240.

More specifically, in embodiments, the state machine 250 is structured and arranged to exhibit four possible states based upon the first input 260a and second input 260b. These states, and the delay function generated by the state machine 250 for each state, are summarized in Table 1.

TABLE 1

| State | First Input (260a) | Second Input (260b) | Delay Function |
|-------|--------------------|---------------------|----------------|
| 1     | 0                  | 0                   | +1             |
| 2     | 1                  | 0                   | −1             |
| 3     | 0                  | 1                   | 0              |
| 4     | 1                  | 1                   | −1             |

Referring to Table 1, in State 1, the first input 260a and the second input 260b are both zero, indicating that they both were captured on the same side of the falling edge of the delayed remote clock signal 230 (e.g., to the right of the falling edge 120, when looking at FIG. 3). Since the inputs 260a and 260b are triggered by the rising edge of the local clock signal 235, State 1 implies that the rising edge of the local clock signal 235 is offset (e.g., to the right) from the falling edge of the delayed clock signal 230. Therefore, the current value of the delay is too short. Accordingly, the state machine 250 increases the current value of delay, represented by input 255, by one unit of adjustment (e.g., the delay function is +1). This new value 245 is output to the delay register 240. In the next iteration, the current value 255 (which equals the new value 245 from the previous iteration) is input to the delay blocks 210a and 210b, thereby shifting the delayed data signal 215 and the delayed remote clock signal 230 relative to the local clock signal 235 from one iteration to the next.

Conversely, State 4 represents the situation where both the first input 260a and the second input 260b have a value of one, indicating the situation where the current value of the delay is too long. Accordingly, the state machine 250 decreases the value of the delay. That is to say, the new value 245 equals the current value 255 minus one unit of adjustment.

Still referring to Table 1, State 2 represents the situation where the first input 260a is one and the second input 260b is zero, indicating the that the first input 260a was captured on one side of the delayed remote clock signal 230 rising edge, and the second input 260b was captured on the other side of the delayed remote clock signal 230 rising edge. Since the target is for the local clock rising edge to be coincident with the delayed remote clock falling edge, State 2 represents a condition where the local clock signal 235 and delayed remote clock signal 230 are 180° out of phase. Accordingly, the state machine 250 decreases the value of the delay. Put another way, the new value 245 equals the current value 255 minus one unit of adjustment.

State 3 represents the situation where the first input 260a is zero and the second input 260b is one, indicating the condition where the rising edge of the local clock signal 235 is substantially coincident with the falling edge of the delayed remote clock signal 230. In embodiments, this is the desired state, such that the state machine 250 outputs a new value 245 equal to the current value 255.

In embodiments, the state machine 250 comprises circuitry on the chip that causes the state machine to operate as described herein. For example, the state machine may comprise an arrangement of logic elements (e.g., AND, NAND, OR, XOR gates, etc.) that are designed and arranged to cause the state machine to operate according to the parameters set forth in Table 1.

Moreover, in implementations, the adjustment unit that is added or subtracted to the current value 255 to create the new value 245 may be any desired value, depending upon the level of granularity of iteration desired for the intended use of the circuit. For example, the unit of adjustment may cause the value stored in the delay register 240 to change by an amount that causes the delay (e.g., caused by delay blocks 210a and 210b) to change by 10 ps. However, the invention is not limited to this value, and any suitable unit of adjustment that produces any desired change in delay may be used within the scope of the invention.

Also, the invention is not limited to the state machine 250 adding or subtracting one adjustment unit per iteration. For example, the state machine 250 may be designed and arranged (e.g., using appropriate logic) such that at State 2 (e.g., the 180° out of phase condition), more than one adjustment unit is added to (or subtracted from) the input value 255.

FIG. 5 shows a block diagram of an alternative system and method for source synchronous communication according to aspects of the invention. Like reference numbers in FIG. 5 represent similar elements described with respect to FIG. 4. In embodiments, the system depicted in FIG. 5 includes a remote data signal 200 and remote clock signal 205 that are input to delay blocks 210a and 210b, which generate a delayed data signal 215 and a delayed remote clock signal 230. The delayed data signal is input to the local data capture register 220.

In embodiments, the system of FIG. 5 also includes a local clock 225 that generates a local clock signal 235, and a dual rank synchronization system comprising registers 265a and 265b. At every cycle of the local clock 225, the current value 255 stored in the delay register 240 is input to the state machine 300. Also triggered on every cycle of the local clock 225, a single value of the state of the delayed remote clock 230 is captured by registers 265a and 265b and input to the state machine as input 305.

According to aspects of the invention, the input 305 may be either a zero or a one (e.g., indicating the state of the delayed remote clock signal 230 at the time of the rising edge of the local clock signal 235). Therefore, state machine 300 operates in two possible conditions. In embodiments, when the input 305 equals zero, the state machine 300 adds one unit of adjustment to the current value 255, and outputs the new value 245 to the delay register 240. On the other hand, when the input 305 equals one, the state machine 300 creates the new value 245 by subtracting one unit of adjustment from the current value 255, and outputs the new value 245 to the delay register 240. Accordingly, when the value of input 305 changes from one iteration to the next (e.g., from zero to one, and vice versa), it is implied that the falling edge of the delayed remote clock signal 230 has been found, and the state machine 300 will adjust the delay in successive iterations to alternate back and forth across the falling edge. In this manner, the system synchronizes the rising edge of the local clock signal to the falling edge of the delayed remote clock signal 230.

Although embodiments of the invention have been described with respect to positive edge triggered logic, the invention is not limited to these implementations. For example, systems according to aspects of the invention may be structured and arranged to align the rising edge of the local clock signal with the rising edge of the delayed remote clock signal.

Figure 6:
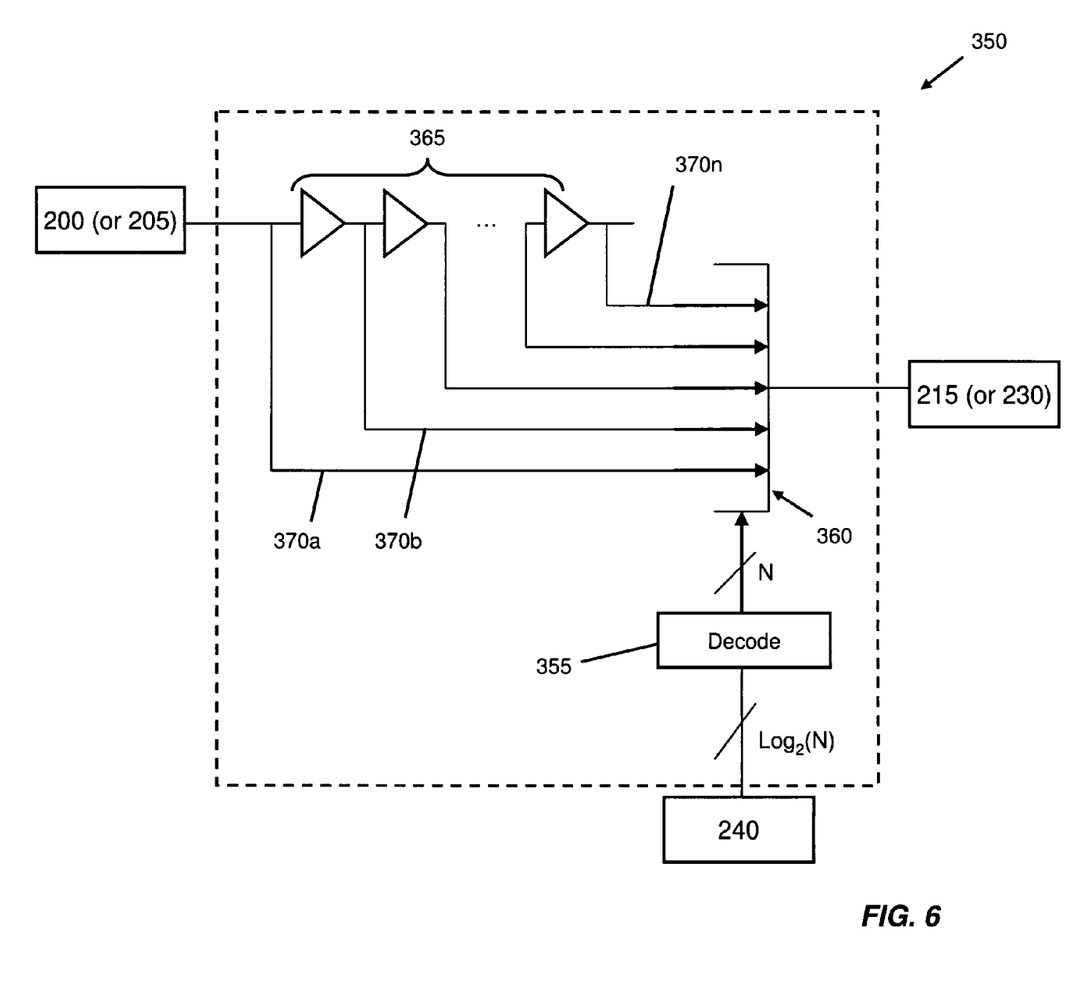
FIG. 6 shows a block diagram of a delay structure according to aspects of the invention.

FIG. 6 shows a block diagram of a delay structure 350 according to aspects of the invention. In embodiments, the delay structure 350 shown in FIG. 6 is utilized as the delay blocks 210a and 210b, described above with respect to FIGS. 4 and 5. According to aspects of the invention, the delay structure 350 receives the remote clock signal 205 and the value from the delay register 240 as inputs, and outputs the delayed remote clock signal 230. Alternatively, the delay structure 350 may receive the remote data signal 200 and the value from the register 240 as inputs, and output the delayed remote data signal 215.

In embodiments, the delay structure 350 comprises a decoder 355, a multiplexer (MUX) 360, and a plurality of buffers 365, all of which are conventional structures, such that further explanation is not necessary for an understanding of the invention. The decoder 355 receives the value of the from the delay register 240 and decodes it to indicate one of a plurality of predefined delay conditions for the MUX 360. The MUX 360, based upon the singular condition indicated by the decoder 355, causes the remote clock signal 205 to exits the series of buffers 365 at a particular line (e.g., delay tap) 370a, 370b, . . . , 370n. As the number of buffers 365 traveled through establishes the delay, the delay structure 350 operates to apply a predefined delay to the remote clock signal 205 (or the data signal 200) based upon the value stored in delay register 240.

The delay structure 350 is not limited to using a plurality of buffers 365, as shown in FIG. 6. Rather, other arrangements may be used. For example, the delay structure 350 may alternatively comprise a voltage controlled delay in which a digital-to-analog converter is used to convert the current value 255 (e.g., an 8 bit delay number) to a linearly equivalent voltage to control the voltage controlled delay. As another exemplary alternative, the delay structure 350 may comprise voltage controlled delay books in the place of conventional re-powering books, in which the delay is provided by a digital-to-analog conversion of the current value 255 (e.g., an 8 bit delay number).

Figure 7:
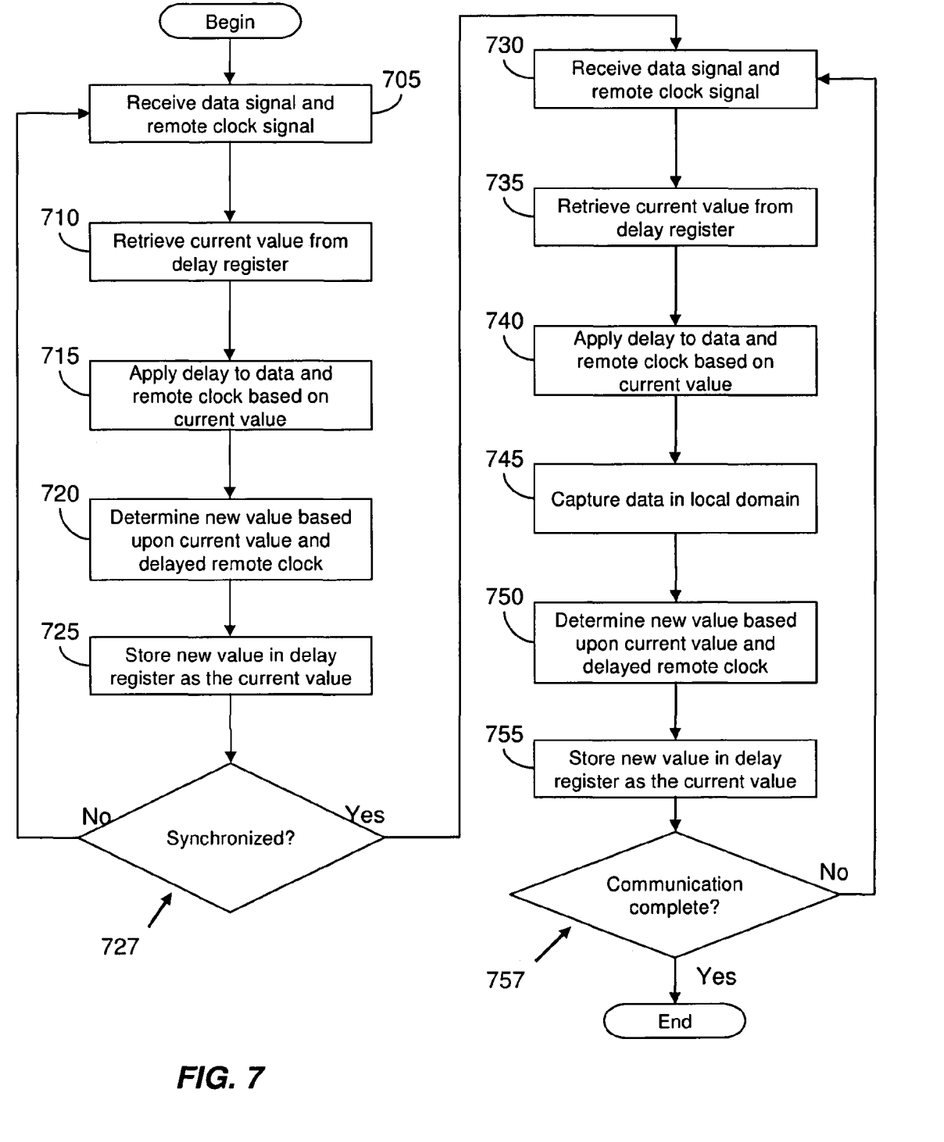
FIG. 7 shows a flow diagram depicting implementations of a method according to aspects of the invention.

FIG. 7 is a flow diagram depicting steps of methods according to aspects of the invention. The steps of FIG. 7 may be implemented in internal logic of a computing system, such as, for example, in internal logic of a storage controller such as that described with respect to FIG. 1. Additionally, the invention can take the form of an entirely hardware embodiment, an entirely software embodiment or an embodiment containing both hardware and software elements.

FIG. 7 may equally represent a high-level block diagram of the invention. The flowchart and/or block diagrams in FIG. 7 (as well as those in FIGS. 2, 4, and 5) illustrate the architecture, functionality, and operation of possible implementations of systems, methods and computer program products according to various embodiments of the present invention. In this regard, each block in the flowchart or block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the flowchart, and combinations of the flowchart illustrations can be implemented by special purpose hardware-based systems that perform the specified functions or acts, or combinations of special purpose hardware and computer instructions and/or software, as described above.

At step 705, a data signal and remote clock signal are received into a system according to aspects of the invention. In embodiments, the data signal and remote clock signal are associated with each other, as in source synchronous communication, such as that described above with respect to FIGS. 4-6. Moreover, the data signal and remote clock signal may be received into a system that is interposed in the source synchronous communication of a chip, such as that described above with respect to FIGS. 4-6. Furthermore, the data signal and remote clock signal may be destined for a local domain on another portion of the same chip (e.g., on-chip communication). Even further, in embodiments, the data signal and remote clock signal are received in delay structures, such as, for example, 210a and 210b described supra.

At step 710, a current value is retrieved or received from a delay register. In embodiments, the delay structure that receives the data signal and remote clock signal also receives a value held in a delay register, such as, for example, as described above with respect to FIGS. 4-6.

At step 715, the delay structure applies a delay to both the data signal and the remote clock signal, resulting in a delayed data signal and a delayed remote clock signal. This may be performed in a manner similar to that described above with respect to FIGS. 4-6.

At step 720, a state machine determines a new value to be held in the delay register. This may be performed in a manner similar to that described above with respect to FIGS. 4-6. For example, the new value may be based upon the current value held in the delay register and also upon one or more inputs representing various states of the delayed remote clock signal captured upon a trigger from a local clock.

At step 725, the new value is stored in the delay register, thereby becoming the new current value. At step 727, in a manner similar to that described above with respect to FIGS. 4-6, a determination is made as to whether the delayed remote clock signal and the local clock signal are synchronized. If the delayed remote clock signal and the local clock signal are not synchronized, then the process returns to step 705, where the next tuning iteration begins. In this manner, steps 705, 710, 715, 720, 725, and 727 comprise a tuning process by which the system according to aspects of the invention searches for and hones in on the synchronized state.

If, at step 727, the delayed remote clock signal and the local clock signal are synchronized, then the process proceeds to step 730, where the delay structure continues to receive the data signal and remote clock signal (e.g., similar to step 705). At step 735, the current value is retrieved or received from the delay register (e.g., similar to step 710). At step 740, a delay that is based upon the current value is applied to both the data signal and the remote clock signal (e.g., similar to step 715).

Still referring to FIG. 7, at step 745, data from the delayed data signal is captured in the local domain. This may be performed in a manner similar to that described above with respect to FIGS. 4-6. For example, the data may be captured local data capture register. Because the delayed remote clock signal and the local clock signal are synchronized, the data is valid for use in the local domain.

At step 750, a new value is determined by the state machine (e.g., similar to step 720). At step 755, the new value is stored in the delay register (e.g., similar to step 725). At step 757, a determination is made whether communication is complete. Step 757 may be performed using appropriate hardware and/or software for conventional techniques for source synchronous communication. If communication is complete at step 757, then the process ends. If communication is not complete at step 757, then the process returns to step 730.

Accordingly, aspects of the invention provide a delay structure and method for on-chip source synchronous communication. In embodiments, the structure is inserted in the source synchronous communication path of the chip and includes a first delay line for lining up the remote clock with the local clock and a second delay line that dynamically shifts the data and captures it at the point where the delayed remote clock lines up with the local clock. The dynamic adjustment of capture helps account for voltage and temperature effects.

An exemplary embodiment comprises a structure and/or method to allow for cross-chip communication with mesochronous clocks (e.g., clocks having a same frequency with unknown and variable phase relationship) to allow phase locking. The structure may comprise: a data delay line, a clock delay line, a capture data register, a remote clock edge detector (e.g., delayed remote clock signal registers), a delay line tap control (e.g., a circuit, such as a state machine, that decides whether to increment, decrement, or hold the tap setting of the delay lines). In implementations, the delay structure (e.g., element 350) allows multiple elements of data to be buffered in the delay chain without additional flip flops. The delay can be aligned on either the negative edge or the positive edge of the remote clock signal. Additionally or alternatively, the control logic may increment or decrement the delay by more than one tap setting (e.g., by more than one unit of adjustment).

Design Structure

Figure 8:
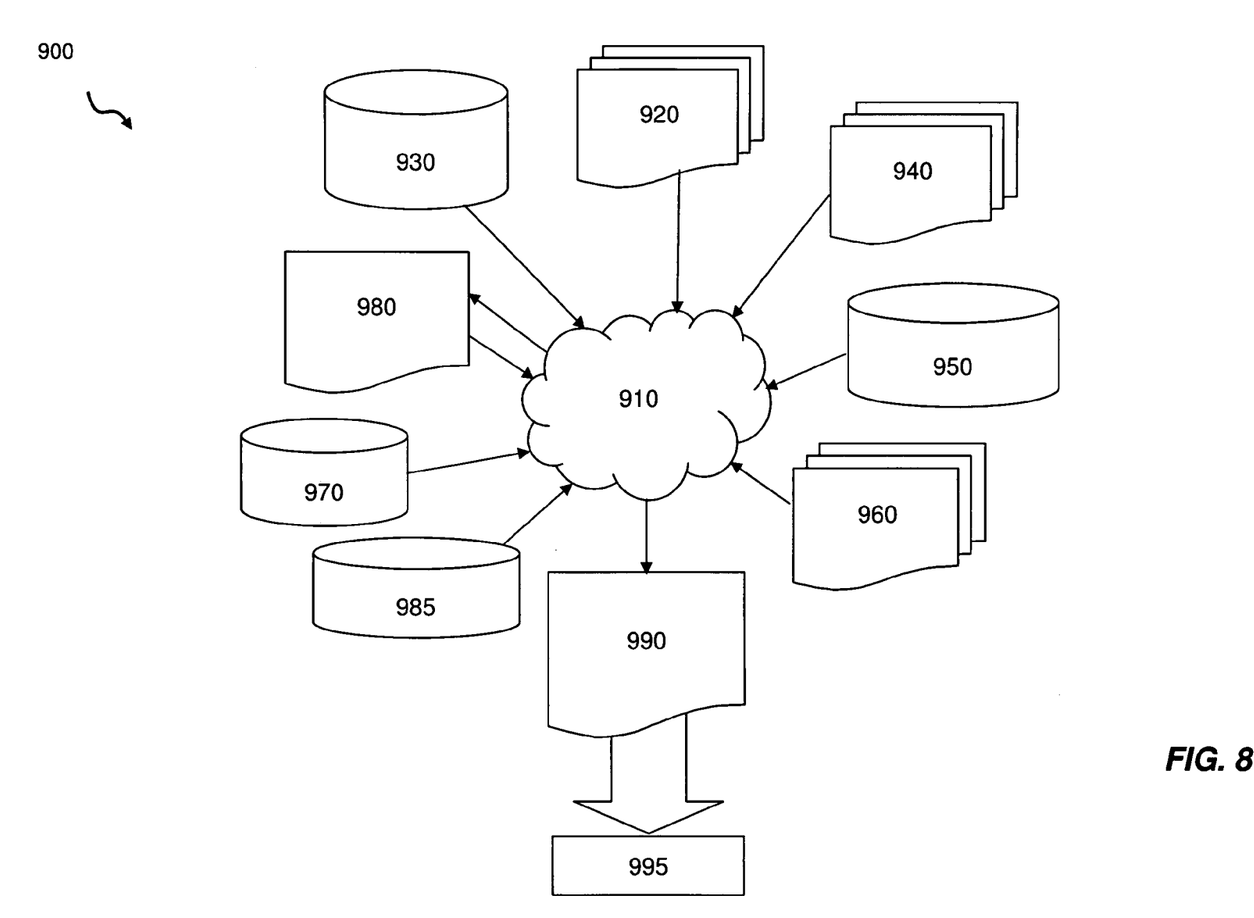
FIG. 8 is a flow diagram of a design process used in semiconductor design, manufacture, and/or test.

FIG. 8 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 4-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 4-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 4-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4-6. In one embodiment, design structure 990 may comprise a compiled, executable HDL simulation model that functionally simulates the devices shown in FIGS. 4-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for source synchronous communication, comprising:
    dynamically adjusting a delay that is applied to a data signal and a remote clock signal until a delayed remote clock signal is synchronized with a local clock signal; and
    capturing data from a delayed data signal associated with the delay in a local domain,
    wherein the dynamically adjusting is based on a value held in a delay register;
    at least one captured state of the delayed remote clock signal comprises a first captured state and a second captured state, each having a value of one of zero and one;
    when the first captured state is zero and the second captured state is zero, a circuit is arranged to change the value in the delay register by adding a predefined adjustment unit,
    when the first captured state is one and the second captured state is zero, the circuit is arranged to change the value in the delay register by subtracting the predefined adjustment unit,
    when the first captured state is zero and the second captured state is one, the circuit is arranged to not change the value in the delay register, and
    when the first captured state is one and the second captured state is one, the circuit is arranged to change the value in the delay register by subtracting the predefined adjustment unit.

2. The method of claim 1, wherein the delay time shifts the data signal by a first amount to generate the delayed data signal, and
    the delay time shifts the remote clock signal by the first amount to generate the delayed remote clock signal.

3. The method of claim 1, further comprising generating the data signal and the remote clock signal at a first location on a chip.

4. The method of claim 3, wherein the local domain is at a second location of the chip.

5. The method of claim 3, wherein the data signal is aligned with the remote clock signal.

6. The method of claim 1, further comprising capturing the at least one captured state of the delayed remote clock signal when the local clock signal goes from a low state to a high state.

7. The method of claim 6, further comprising one of:
    synchronizing a falling edge of the delayed remote clock signal with a rising edge of the local clock signal, and
    synchronizing a rising edge of the delayed remote clock signal with a falling edge of the local clock signal.

8. A method for on-chip source synchronous communication, comprising:
    providing a circuit comprising hardware structured and arranged to:
        apply a delay to a data signal and a remote clock signal aligned with the data signal, wherein the delay is based upon a value held in a delay register;
        change the value in the delay register based upon at least one captured state of a delayed remote clock signal, wherein the at least one captured state of the delayed remote clock signal is captured upon a change of state of a local clock signal; and repeat the applying and the changing at least until the delayed remote clock signal is aligned with the local clock signal, wherein the at least one captured state of the delayed remote clock signal comprises a first captured state and a second captured state, each having a value of one of zero and one;

when the first captured state is zero and the second captured state is zero, the circuit is further arranged to change the value in the delay register by adding a predefined adjustment unit, when the first captured state is one and the second captured state is zero, the circuit is further arranged to change the value in the delay register by subtracting the predefined adjustment unit, when the first captured state is zero and the second captured state is one, the circuit is further arranged to not change the value in the delay register, and when the first captured state is one and the second captured state is one, the circuit is further arranged to change the value in the delay register by subtracting the predefined adjustment unit.

9. The method of claim 8, wherein the circuit is provided in a source synchronous communication path of a chip.

10. The method of claim 8, wherein the circuit repeats the applying and the changing after the delayed remote clock signal is aligned with the local clock signal.

11. The method of claim 8, wherein:
the data signal and the remote clock signal are generated at a first location on a chip, and
the local clock signal is generated by a local clock associated with a local domain that receives the data signal after the data signal has been delayed.

12. A method for on-chip communication, comprising:
receiving a data signal and a remote clock signal associated with the data signal; and
applying a dynamically determined delay to both the data signal and the remote clock signal to create a delayed data signal and a delayed remote clock signal, wherein the delayed remote clock signal is synchronized with a local clock associated with a local domain that receives the delayed data signal;

at least one captured state of the delayed remote clock signal comprises a first captured state and a second captured state, each having a value of one of zero and one;

when the first captured state is zero and the second captured state is zero, a circuit is arranged to change a value in a delay register by adding a predefined adjustment unit, when the first captured state is one and the second captured state is zero, the circuit is arranged to change the value in the delay register by subtracting the predefined adjustment unit, when the first captured state is zero and the second captured state is one, the circuit is arranged to not change the value in the delay register, and when the first captured state is one and the second captured state is one, the circuit is arranged to change the value in the delay register by subtracting the predefined adjustment unit.

13. The method of claim 12, wherein the receiving and the applying are performed by the circuit arranged within a source synchronous communication path on a chip.

14. The method of claim 13, wherein the circuit comprises a state machine that iteratively adjusts the dynamically determined delay based upon the at least one captured state of the delayed remote clock signal.

15. The method of claim 14, wherein the at least one captured state of the delayed remote clock signal is captured upon a change of state of the local clock signal.

* * * * *